(12) United States Patent
Chen et al.

(10) Patent No.: US 9,316,901 B2
(45) Date of Patent: Apr. 19, 2016

(54) METHOD FOR FORMING PATTERNS

(71) Applicant: UNITED MICROELECTRONICS CORP., Hsin-Chu (TW)

(72) Inventors: Hsin-Yu Chen, Nantou County (TW); Chia-Wei Huang, Kaohsiung (TW); Chun-Hsien Huang, Tainan (TW); Shih-Chun Tsai, Pingtung County (TW); Kai-Lin Chuang, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 234 days.

(21) Appl. No.: 14/259,173

(22) Filed: Apr. 23, 2014

(65) Prior Publication Data
US 2014/0220482 A1    Aug. 7, 2014

Related U.S. Application Data

(63) Continuation of application No. 13/633,876, filed on Oct. 3, 2012, now Pat. No. 8,748,066.

(51) Int. Cl.
G03F 9/00      (2006.01)
G03F 1/36      (2012.01)
G03F 1/70      (2012.01)
G03F 1/68      (2012.01)

(52) U.S. Cl.
CPC .. G03F 1/36 (2013.01); G03F 1/70 (2013.01); G03F 1/68 (2013.01)

(58) Field of Classification Search
CPC .......................................................... G03F 9/00
USPC .......... 430/5, 30, 322, 323, 324, 394; 355/73; 716/53–55
See application file for complete search history.

(56) References Cited

U.S. PATENT DOCUMENTS

| | | | |
|---|---|---|---|
| 6,258,489 B1 | 7/2001 | Stanton |
| 6,303,253 B1 | 10/2001 | Lu |
| 7,424,699 B2 | 9/2008 | O'Brien |
| 7,902,671 B2 | 3/2011 | Nam |
| 8,058,177 B2 | 11/2011 | Weiss |
| 2009/0181314 A1 | 7/2009 | Shyu |
| 2009/0300567 A1 | 12/2009 | Rathsack |

*Primary Examiner* — Stephen Rosasco
(74) *Attorney, Agent, or Firm* — Winston Hsu; Scott Margo

(57) ABSTRACT

A method for forming patterns includes the following steps. A first layout including a first target pattern and a first unprintable dummy pattern is provided. A second layout including a second target pattern and a second printable dummy pattern are provided, wherein at least part of the second printable dummy pattern overlaps the first unprintable dummy pattern exposure limit, such that the second printable dummy pattern cannot be formed in a wafer.

19 Claims, 8 Drawing Sheets

METHOD FOR FORMING PATTERNS

CROSS REFERENCE TO RELATED APPLICATIONS

This patent application is a continuation application of and claims priority to U.S. patent application Ser. No. 13/633,876, filed on Oct. 3, 2012, and entitled "METHOD FOR FORMING PHOTOMASKS", the entire contents of which are incorporated herein by reference.

BACKGROUND OF THE INVENTION

1. Field of the Invention

The present invention relates generally to a method for forming patterns, and more specifically to a method for forming patterns that can be applied to layouts having a sacrificial pattern with a dimension larger than the exposure limit, wherein the method can be paired with a self-aligned via process to prevent the sacrificial pattern from being formed on the wafer.

2. Description of the Prior Art

In semiconductor fabrication processes, lithography processes are important steps to transfer integrated circuit layouts to semiconductor wafers. A wafer manufacturing company designs a mask layout according to an integrated circuit layout and then fabricates a mask having the designed mask layout. By way of lithography processes, the pattern on the mask (i.e. the mask pattern) is transferred to a photoresist layer on the surface of a semiconductor wafer with a specific scale.

As the complexity and integration of integrated circuits continues to progress, the size of each segment of a mask pattern is designed to be smaller. The exposure limit of every segment fabricated by exposure is limited to the resolution limit of the optical exposure tool used during the transfer step of the mask pattern, however. One problem that easily arises during the exposure of a mask pattern with high-density arranged segments to form a pattern on a photoresist is the optical proximity effect. Resolution losses occur because of overexposure or underexposure, which causes deviations in the original pattern on the photoresist. Many methods have been used to improve deviation caused by the optical proximity effect in order to improve the quality of the transferred pattern. The most popular method is the optical proximity correction (OPC). There is a variety of commercial optical proximity correction software that can theoretically correct the mask pattern in order to acquire more accurate patterns on a wafer.

SUMMARY OF THE INVENTION

The present invention provides a method for forming photomasks (patterns), by forming a sacrificial pattern with a dimension larger than the exposure limit of a photomask (layout) to increase the luminous flux of the photomask during the exposure step. The method can be paired with a self-aligned via process to prevent the sacrificial pattern from being printed (formed) on the wafer.

The present invention provides a method for forming patterns including the following steps. A first layout including a first target pattern and a first unprintable dummy pattern is provided. A second layout including a second target pattern and a second printable dummy pattern is provided, wherein at least part of the second printable dummy pattern overlaps the first unprintable dummy pattern, such that the second printable dummy pattern cannot be formed in a wafer.

According to the above, the present invention provides a method for forming photomasks (patterns), which forms a second printable dummy pattern with a dimension larger than the exposure limit in a second photomask (layout) so as to increase the luminous flux of the second photomask during the exposure step. Due to a first target pattern of a first photomask (layout) not overlapping the second printable dummy pattern, the printing of a second printable dummy pattern on a wafer can be prevented. in this way, the luminous flux of the second target pattern can be increased through forming the second printable dummy pattern with a dimension larger than the exposure limit next to the second target pattern, and the second printable dummy pattern can be prevented from being printed on the wafer by also performing a self-aligned via method, thereby shrinking the exposure limit of the second target pattern, which allows both the physical targets and the wafer layout to be achieved.

These and other objectives of the present invention will no doubt become obvious to those of ordinary skill in the art after reading the following detailed description of the preferred embodiment that is illustrated in the various figures and drawings.

DETAILED DESCRIPTION

Patterns described in the following may be printable or unprintable, according to exposure conditions such as wavelengths of sources. A first photomask 10 is exposed by using a first source under a first exposure condition, while a second photomask 20 is exposed by using a second source under a second exposure condition, wherein the first source may be common with or different from the second source, and the first exposure condition may be common with or different from the second exposure condition. For example, when using a 193 nanometers (nm) immersion source and exposure condition, the mask dimension of via patterns that can be exposed is about 60 nanometers (nm). The present invention is applied for forming photomasks in the following embodiment, but the present invention can also be applied for forming patterns or layouts simulated by a device such as a calculator or a computer etc., depending upon the needs.

Figure 1:
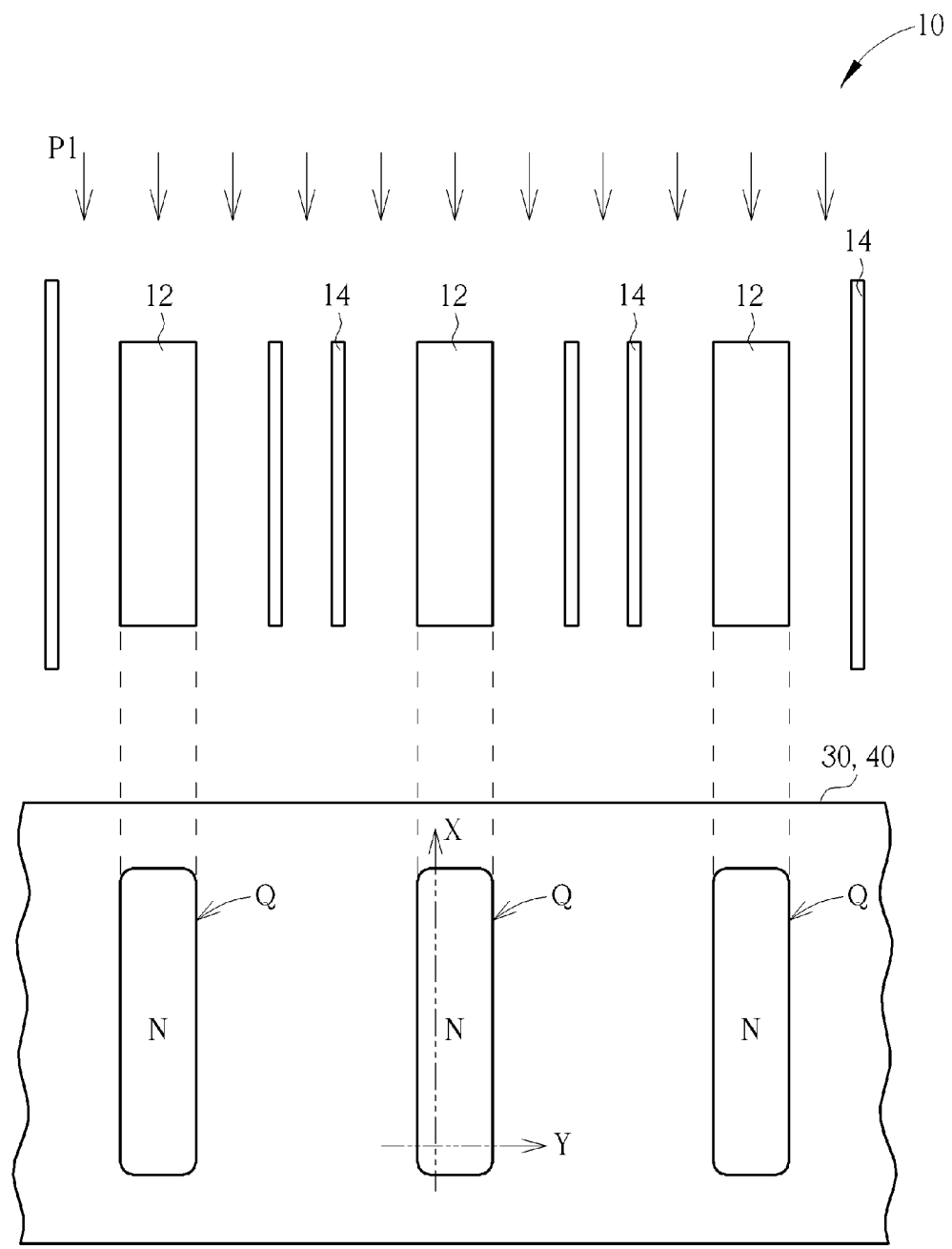
FIGS. 1-3 schematically depict top views of a method for forming photomasks according to an embodiment of the present invention.
Figure 2:
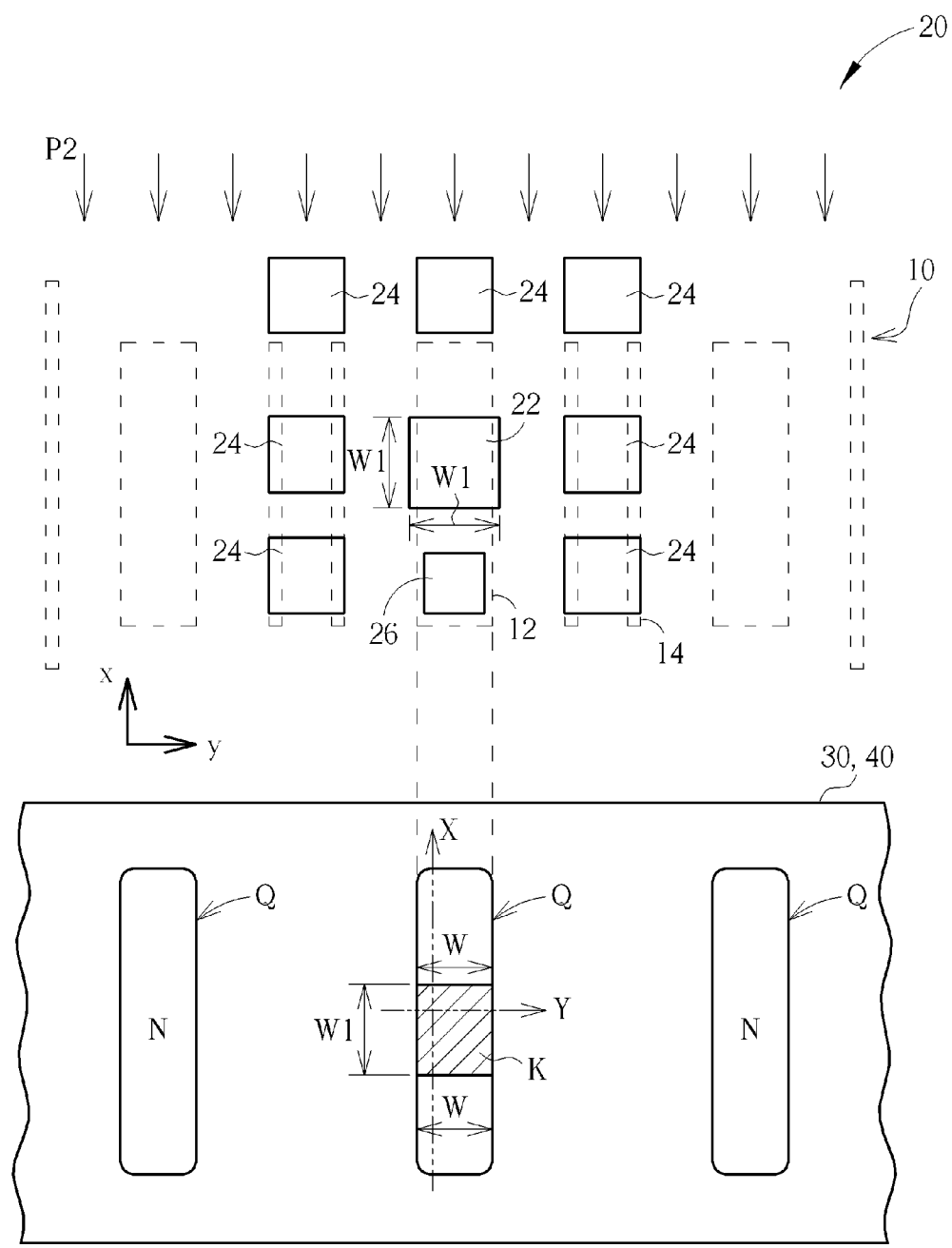
Figure 3:
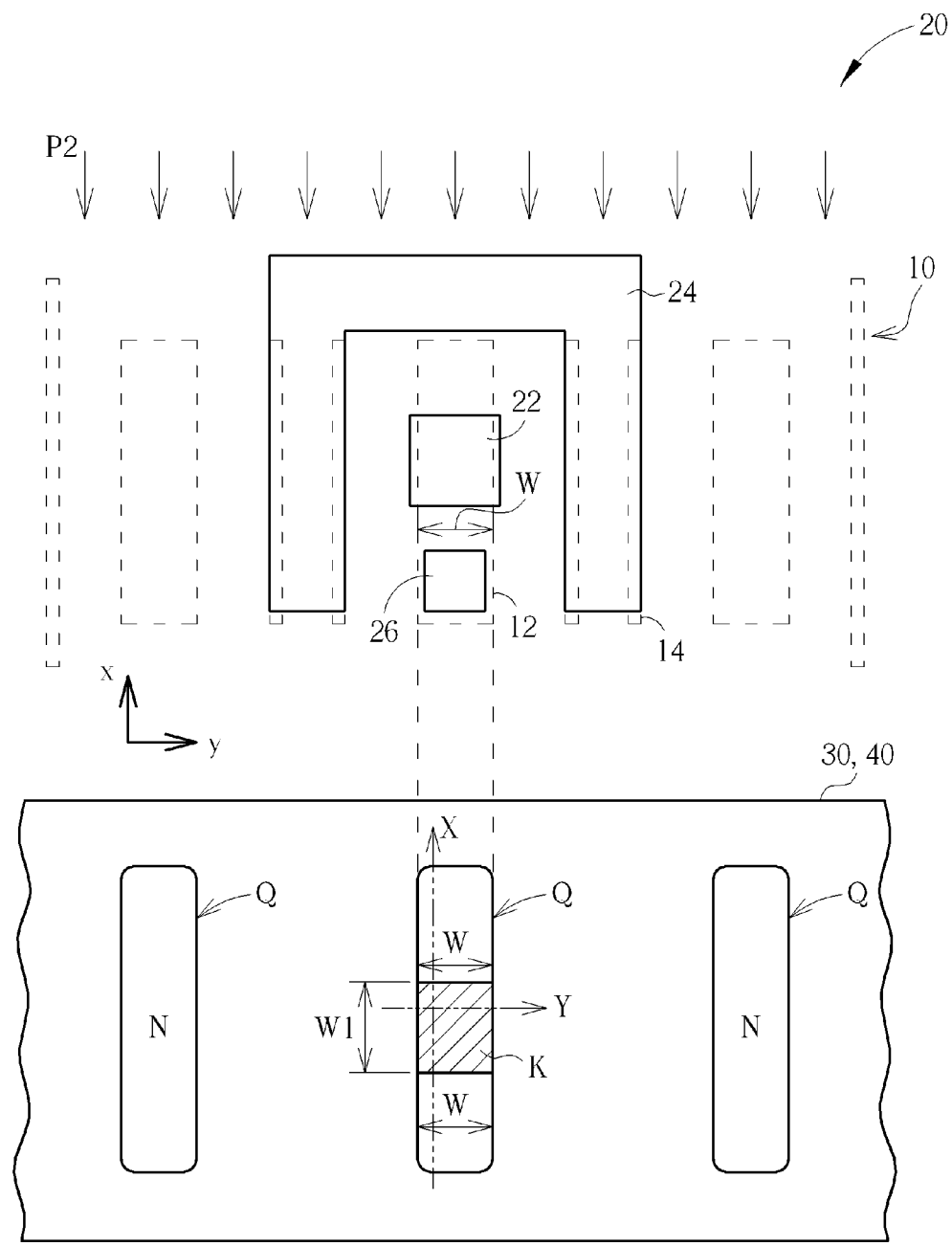

FIGS. 1-3 schematically depict top views of a method for forming photomasks according to an embodiment of the present invention. FIGS. 4-8 schematically depict cross-sectional views of a method for forming photomasks according to an embodiment of the present invention.

As shown in FIG. 1, the top diagram of FIG. 1 is a top view of a first photomask 10, and the bottom diagram of FIG. 1 is a top view of a wafer 40 corresponding to the first photomask 10, and a mask 30 located on the wafer 40. The first photomask 10 including a first target pattern 12 and a first unprintable dummy pattern 14 is provided. A pattern printing process is performed on the wafer 40 by using the first photomask 10. The first target pattern 12 needs to be printed on the wafer 40 or on the mask 30 that is on the wafer 40, while the first unprintable dummy pattern 14 serves as a virtual pattern for adjusting the luminous flux of the first target pattern 12 during the exposure step. The dimension of the first unprintable dummy pattern 14 is smaller than the first exposure limit under the first exposure condition using the first source (which represents the minimal resolving dimension under the first exposure condition using the first source), so that the first unprintable dummy pattern 14 will not be printed on the wafer 40 or on the mask 30.

As shown in FIG. 1, as a first process P1 is performed, only the first target pattern 12 of the first photomask 10 can be printed on the mask 30 on the wafer 40, and a first corresponding pattern Q is formed on the mask 30, while the first unprintable dummy pattern 14 is not printed on the mask 30 since the dimension of the first unprintable dummy pattern 14 is smaller than the first exposure limit. The mask 30 may include at least a hard mask (not shown), such as an isolation material or a metal material etc., and a photosensitive material, such as a photoresist, may also be further formed on the mask 30. The first process P1 may comprise lithographic and etching procedures: the photoresist on the mask 30 is exposed and developed, and then the mask 30 is etched by using the patterned photoresist. As the first corresponding pattern Q is formed on the mask 30, a corresponding part N of the wafer 40 is exposed. In another embodiment, other target material layers may be further formed under the mask 30 and the first corresponding pattern Q of the mask 30 may be further printed on the target material layers, or the target material layers can serve as buffers for buffering the mask 30 and the wafer 40 without directly exposing the wafer 40.

In this embodiment, the first target pattern 12 is used to define the pattern of metal wires of a structure such as a dual damascene structure, so that the first corresponding pattern Q formed on the mask 30 is a trench pattern having a plurality of trenches; the first unprintable dummy pattern 14 is used to increase the luminous flux of the first target pattern 12, so that the first unprintable dummy pattern 14 is not printed on the mask 30 and the wafer 40. In this embodiment, the first process P1 just exposes and develops the mask 30 to expose the wafer 40; in another embodiment, apart from exposing and developing the mask 30, the corresponding part N of the wafer 40 is also etched and a plurality of trenches are formed in the wafer 40 as the first process P1 is performed. The first unprintable dummy pattern 14 is located beside the first target pattern 12, and the first unprintable dummy pattern 14 may also be a trench pattern, in particular a trench pattern parallel to the first target pattern 12, so as to increase the luminous flux of the first target pattern 12, but is not limited thereto. In another embodiment, the first target pattern 12 may also be a conductive pattern used for defining a gate structure, so that the first corresponding pattern Q formed in the mask 30 is a strip pattern having a plurality of wires, and the first unprintable dummy pattern 14 is used to increase the luminous flux of the first target pattern 12 but is not printed on the mask 30 and the wafer 40. Additionally, the first unprintable dummy pattern 14 may not be formed close to the first target pattern 12, depending upon the needs. To sum up, the first unprintable dummy pattern 14 will not be printed on the mask 30 and the wafer 40 whether the first unprintable dummy pattern 14 is formed or not.

Figure 4:
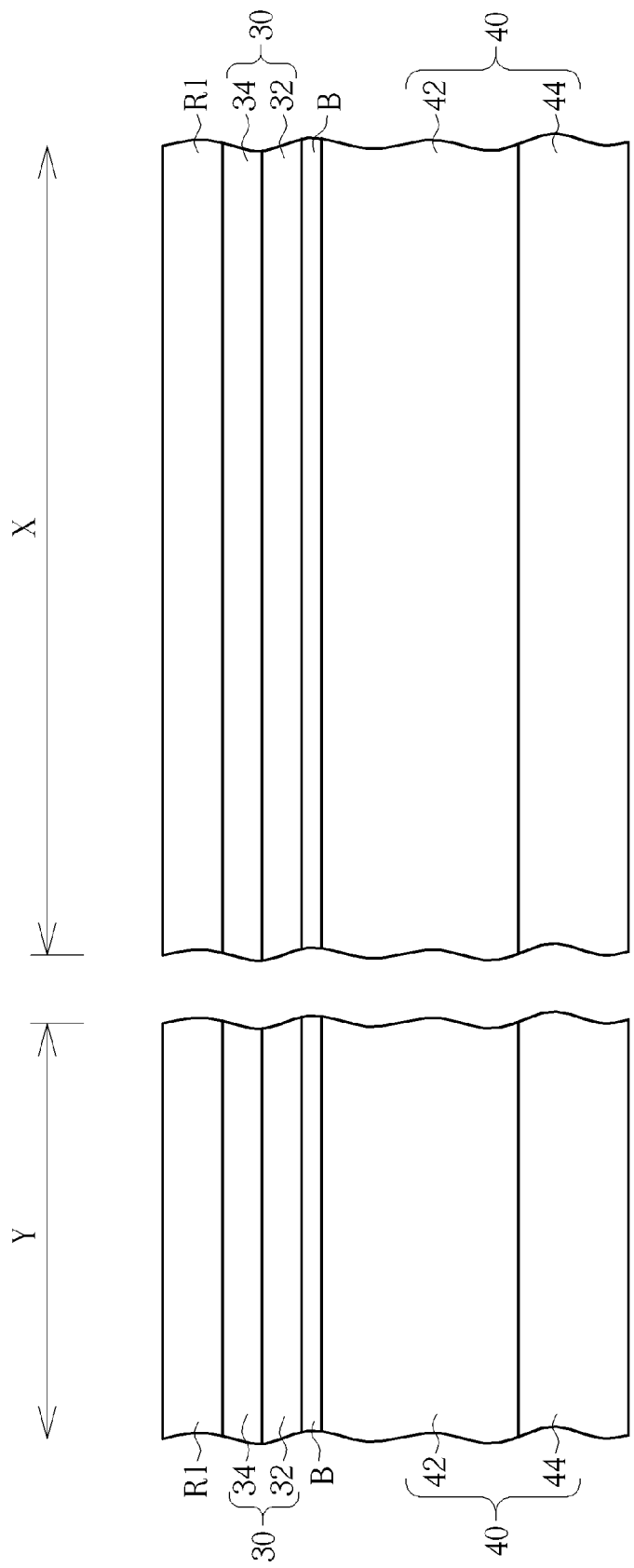
FIGS. 4-8 schematically depict cross-sectional views of a method for forming photomasks according to an embodiment of the present invention.
Figure 5:
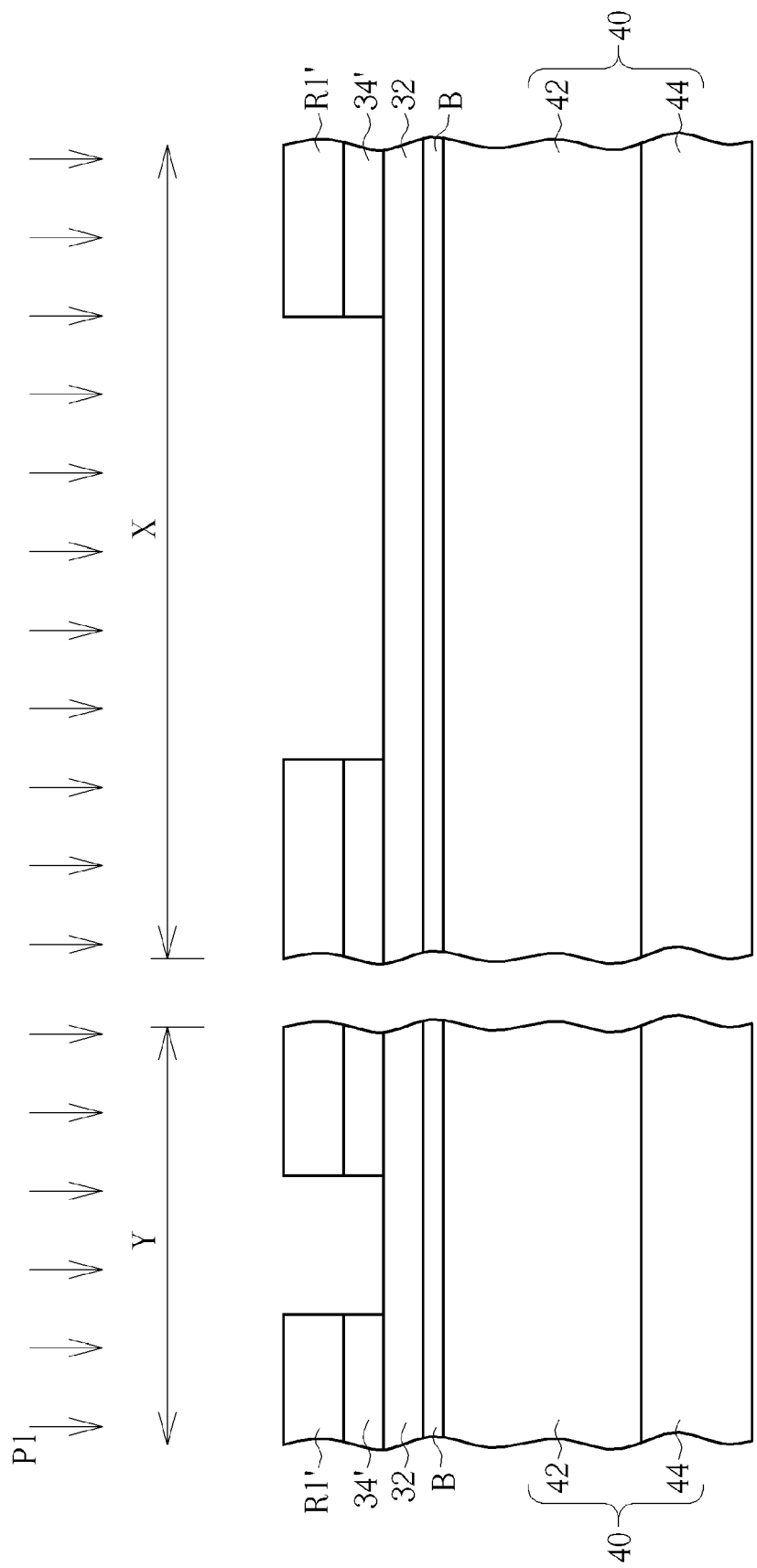
Figure 6:
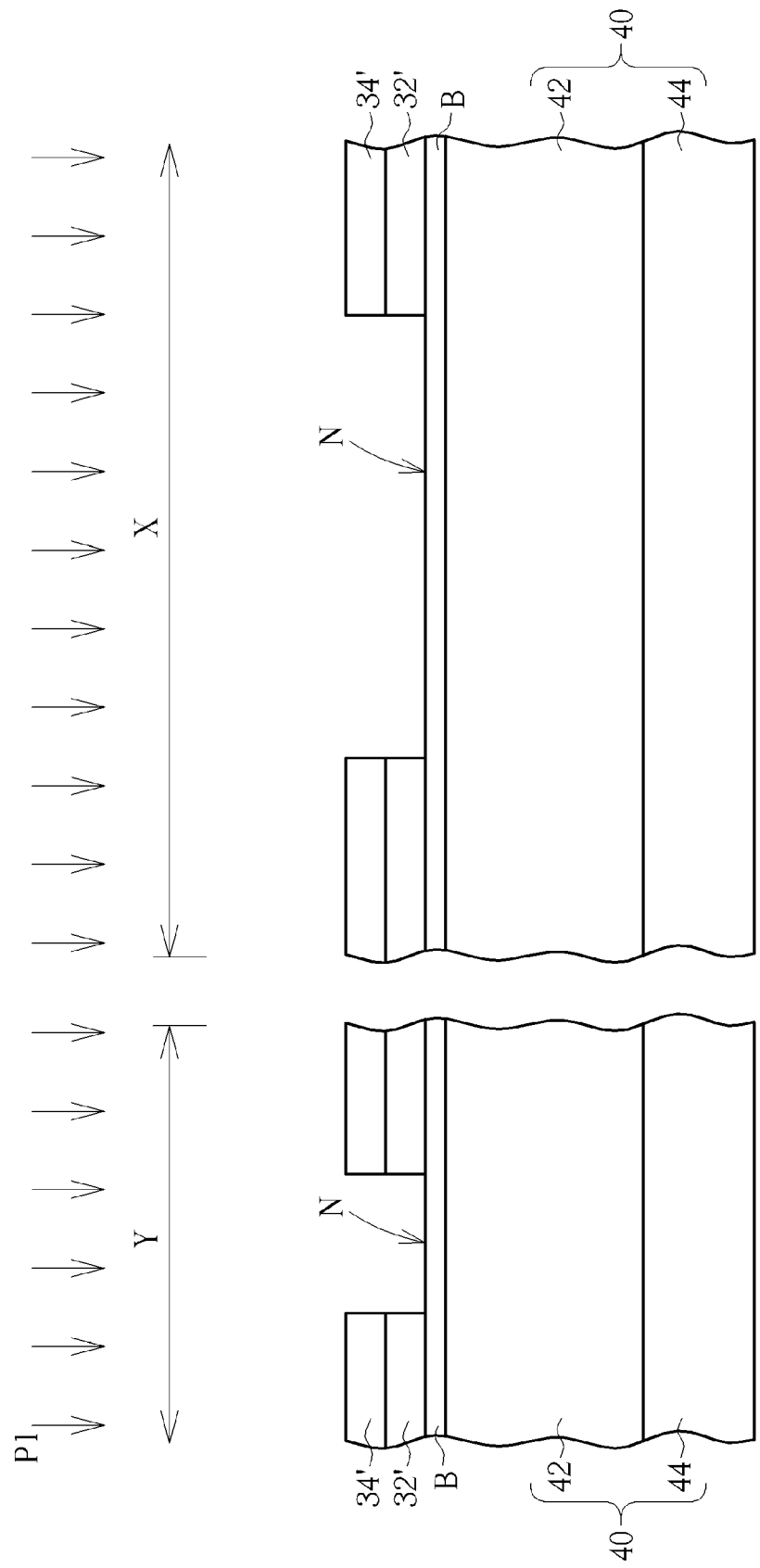

To illustrate the wafer 40 and the mask 30 located on the wafer 40 clearly, FIGS. 4-6 are presented, which schematically depict cross-sectional views of a method for forming photomasks according to an embodiment of the present invention. As shown in FIGS. 4-6, the right diagrams are cross-sectional views taken along an x direction of the bottom diagram of FIG. 1, and the left diagrams of FIGS. 4-6 are cross-sectional views taken along a y direction of the bottom diagram of FIG. 1.

As shown in FIG. 1 and FIG. 4, the wafer 40 and the mask 30 thereon are provided. A photoresist layer R1 is located on the mask 30 on the wafer 40 for performing subsequent processes such as lithographic and etching processes. The mask 30 may include a stacked material layer. For example, the mask 30 may include an oxide layer and a metal layer, etc. In this embodiment, the mask 30 may include a first material layer 32 and a second material layer 34 located on the first material layer 32. The second material layer 34 may include an oxide layer and the first material layer 32 may include a metal layer serving as a hard mask, but it is not limited thereto. A sacrificial oxide layer B etc. may be formed between the wafer 40 and the mask 30 serving as an etch stop layer for later etching processes, in order to prevent the wafer 40 from being damaged during etching. The wafer 40 may include a substrate 44 and a target material layer 42 located on the substrate 44. The substrate 44 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. The target material layer 42 may be an inter-dielectric layer, an ultra-low-k material layer or a nitrogen-doped SiC (NDC) layer, and the first corresponding pattern Q in the mask 30 is further printed in the target material layer 42 to form a trench pattern of structures, such as a dual damascene structure, but it is not limited thereto.

A first process P1 is performed. As shown in FIG. 5, the photoresist layer R1 is patterned through a lithography process to form a patterned photoresist layer R1', which means that the first target pattern 12 of FIG. 1 has been transferred to the photoresist layer R1 by that time. The corresponding pattern of the first target pattern 12 is formed on the patterned photoresist layer R1' while the corresponding pattern of the first unprintable dummy pattern 14 is not formed on the patterned photoresist layer R1'. Then, the second material layer 34 is etched by applying the patterned photoresist layer R1', and a patterned second material layer 34' is formed. The patterned photoresist layer R1' is then removed. As shown in FIG. 6, the first material layer 32 is etched by applying the patterned second material layer 34', and a patterned first material layer 32' is formed, which means the first corresponding pattern Q of FIG. 1 is formed by that time.

The pattern of the first photomask 10 of FIG. 1 is transferred to the mask 30. It is emphasized that only the first target pattern 12 of FIG. 1 is transferred to the mask 30 (including the first material layer 32 and the second material layer 34), and the first unprintable dummy pattern 14 is not transferred to the mask 30.

The top diagram of FIG. 2 is a top view of a second photomask 20, and the bottom diagram of FIG. 2 is a top view of the wafer 40 and the mask 30 on the wafer 40. The first photomask 10 in the top diagram of FIG. 1 is also depicted by dotted lines for disclosing the relative positions of the second photomask 20 and the first photomask 10, so that the printed locations of the patterns of the first photomask 10 and the second photomask 20 in the mask 30 and the wafer 40 can be disclosed clearly. Only a pattern transferring process using the second photomask 20 is actually performed on the wafer 40, however.

As shown in FIG. 2, the second photomask 20 includes a second target pattern 22 and a second printable dummy pattern 24, and at least part of the second target pattern 22 will be printed on the wafer 40 but none of the second printable dummy pattern 24 will be printed in the wafer 40. More precisely, the second printable dummy pattern 24 disposed surrounding the second target pattern 22 is used to increase the luminous flux of the second target pattern 22 during exposure, thereby shrinking the exposure limit of the second target pattern 22. The second printable dummy pattern 24 is transferred to the photosensitive material (not shown), such as a photoresist, on the mask 30 by a lithography process, but it will not be transferred to the wafer 40 or the mask 30 by an etching process using the patterned photoresist. In the present invention, the dimension of the second printable dummy pattern 24 of the second photomask 20 is larger than the second exposure limit to effectively increase the luminous flux of the second target pattern 22 and shrink the exposure limit of the second target pattern 22. The second printable dummy pattern 24 does not overlap the first target pattern 12 of the first photomask 10, and at least a part of the second printable dummy pattern 24 overlaps the first unprintable dummy pattern 14. Thus, since the first unprintable dummy pattern 14 is not transferred onto the mask 30, the second printable dummy pattern 24 cannot be printed on the wafer 40, even if the dimension of the second printable dummy pattern 24 is larger than the exposure limit. More precisely, the patterned first material layer 32' is included in the mask 30 to serve as a hard mask, and the part of the hard mask corresponding to the second printable dummy pattern 24 cannot be etched to expose the wafer 40, which prevents the second printable dummy pattern 24 from being printed on the wafer 40 as the second target pattern 22 is printed on the wafer 40. In this embodiment, the patterned second material layer 34' on the patterned first material layer 32' is etched and a part of the second printable dummy pattern 24 is transferred as the second target pattern 22 is printed on the wafer 40, and the patterned first material layer 32' will stop the etching process so that the second printable dummy pattern 24 will not be printed on the wafer 40, but the process is not limited thereto.

Furthermore, the second mask 20 includes a second unprintable dummy pattern 26, which overlaps the first target pattern 12 of the first mask 10 but cannot be printed on the wafer 40.

As the second process P2 is performed, only the part of the second target pattern 22 overlapping the first corresponding pattern Q is transferred to the wafer 40, and a printed pattern K is therefore formed on the wafer 40, as shown in the bottom diagram of FIG. 2. As the width of the second target pattern 22 along the X direction is w1, the width of the printed pattern K along the X direction is also w1 because the second target pattern 22 in the X direction is entirely transferred to the wafer 40; as the width of the second target pattern 22 along the y direction is w1, the width of the printed pattern K along the y direction shrinks to w because the second target pattern 22 sticking out from the first corresponding pattern Q will be stopped by the mask 30 and will not be printed on the wafer 40. By applying the self-aligned via (SAV) method, the luminous flux of the second target pattern 22 can be increased by increasing the dimension of the second target pattern 22, and a smaller dimension for the printed pattern K can be obtained, which shrinks the exposure limit of the second target pattern 22 and achieves the physical targets. In a semiconductor process, at least a (printed) pattern is formed in a dense region and an isolation (ISO) region of the wafer 40, wherein the luminous flux of the pattern in the dense region is larger than the luminous flux of the pattern in the isolation (ISO) region, thereby giving the pattern in the dense region a lower exposure limit. In a preferred embodiment, the exposure limit of the pattern in the isolation (ISO) region can be reduced and a suitable luminous flux can be obtained, enabling the exposure limit of the pattern in the isolation (ISO) region to be similar to the exposure limit of the pattern in the dense region The second process P2 may include a lithographic and an etching procedure, which exposes and develops the second target pattern 22 and the second printable dummy pattern 24 on at least a part of the mask (preferably a photoresist formed on the mask), and then forms the printed pattern K corresponding to the second target pattern 22 on the wafer 40. The second target pattern 22 may be a via pattern of a structure, such as a dual damascene structure, enabling the printed pattern K to be a via in the wafer 40, but it is not limited thereto. In another embodiment, the second target pattern 22 may be another pattern, and the printed pattern K may be a plurality of vias or another pattern, depending upon the needs. In a preferred embodiment, the second printable dummy pattern 24 surrounds the second target pattern 22 so as to increase the luminous flux of the second target pattern 22 effectively. In this embodiment, the second printable dummy pattern 24 is a via pattern as shown in FIG. 2; in other words, the second printable dummy pattern 24 is a plurality of vias surrounding the second target pattern 22. In another embodiment, the second printable dummy pattern 24 may be a U-shaped pattern surrounding the second target pattern 22 as shown in FIG. 3, wherein the U-shaped pattern can have a larger luminous flux of the second target pattern 22 than that of the via pattern of FIG. 2. It is worth noting that the second printable dummy pattern 24 does not overlap the first target pattern 12 of the first photomask 10, but at least part of the second printable dummy pattern 24 overlaps the first unprintable dummy pattern 14. Likewise, the part of the second target pattern 22 in FIG. 3 sticking out from the first corresponding pattern Q can increase the luminous flux of the second target pattern 22. The second target pattern 22 sticking out from the first corresponding pattern Q cannot be printed on the target material layer 42 or the wafer 40 because of the second target pattern 22 sticking out from the first corresponding pattern Q being blocked by the first material layer 32' (used as a hard mask) in the mask 30. Only the part of the second target pattern 22 which overlaps the first corresponding pattern Q can be printed on the target material layer 42 or on the wafer 40.

Figure 7:
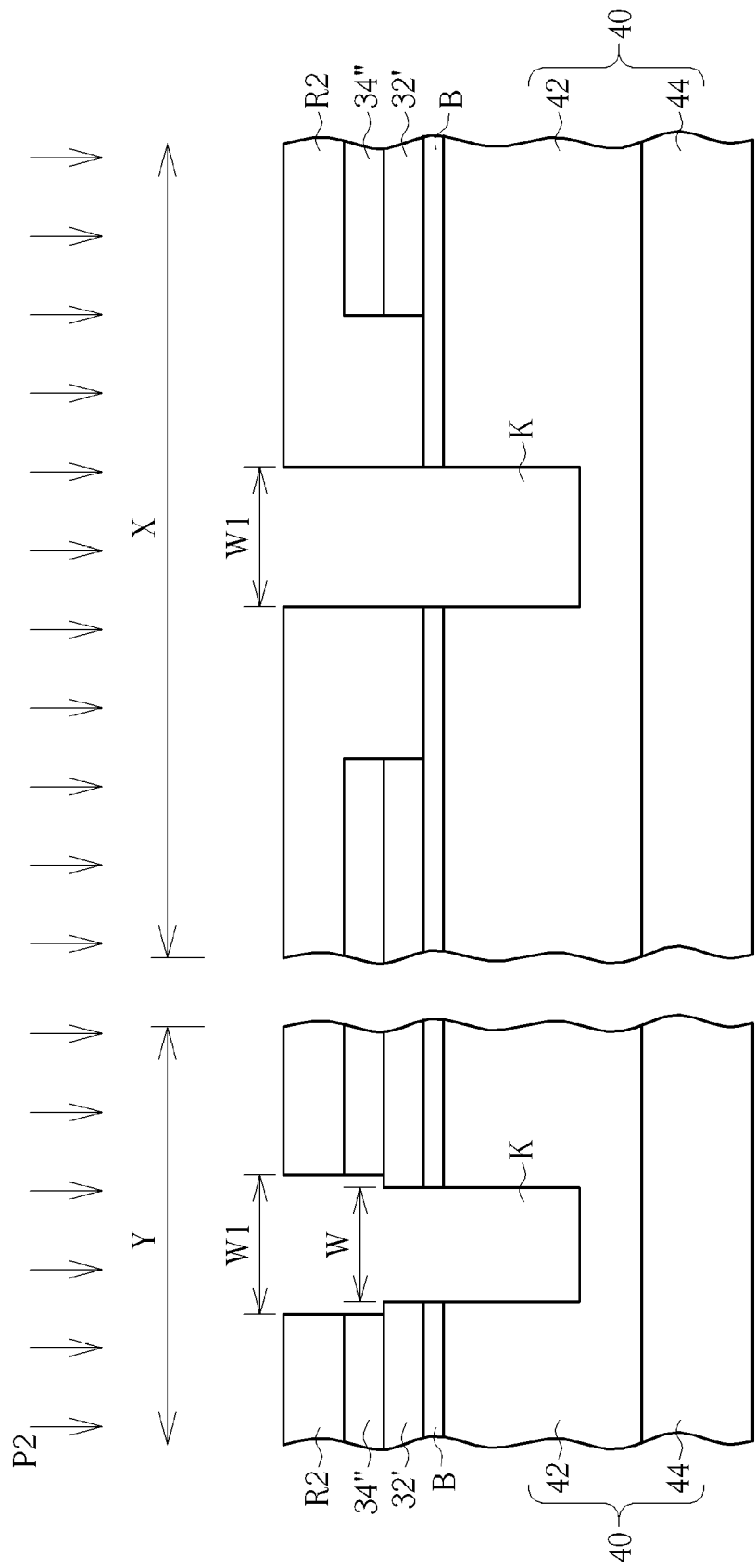

To illustrate more clearly the wafer 40 and the mask 30 thereon in the bottom diagram of FIG. 2, FIG. 7 is presented, wherein FIG. 7 schematically depicts a cross-sectional view of a method for forming photomasks according to an embodiment of the present invention. The right diagram of FIG. 7 is a cross-sectional view taken along the x direction of FIG. 2, and the left diagram of FIG. 7 is a cross-sectional view taken along the y direction of FIG. 2.

As shown in FIG. 2 and FIG. 7, the second process P2 is performed. A photoresist layer (not shown) is formed to entirely cover the wafer 40 and the mask 30, and the photoresist layer (not shown) is patterned through a lithography process to form a patterned photoresist layer R2, wherein the corresponding pattern of the second target pattern 22 and the second printable dummy pattern 24 are formed on the patterned photoresist layer R2. Then, a patterned second material layer 34" is formed by using the patterned photoresist layer R2. The exposed target material layer 42 or the exposed wafer 40 is etched, and the printed pattern K is therefore formed in the wafer 40. It is emphasized that only the second material layer 34', the target material layer 42 or the wafer 40 can be etched by the second process P2, but the patterned first material layer 32' cannot be etched because the corresponding pattern of the first unprintable dummy pattern 14 cannot be formed in the mask 30 when a suitable etching selectively material is chosen. Thus, the second printable dummy pattern 24 can only be transferred to the patterned second material layer 34" through the second process P2, but cannot be transferred to the wafer 40 due to the patterned first material layer 32' on the wafer 40, as shown in the left diagram of FIG. 7 and FIG. 2. Only the part of the second target pattern 22 corresponding to the exposed target material layer 42 or the exposed wafer 40 can be transferred to the target material layer 42 or the wafer 40, and even if the second printable dummy pattern 24 is transferred to the photoresist layer R2, none of the second printable dummy pattern 24 will be printed to the first material layer 32' of the mask 30. The width of the patterned second material layer 34" along the y direction is w1, but the width of the target material layer 42 or the wafer 40 along the y direction shrinks to w, which is similar to the width of the patterned first material layer 32'. As shown in the right-hand diagram of FIG. 7, the second target pattern 22 along the x direction can be entirely transferred to the target material layer 42 or the wafer 40 because the second target pattern 22 is not on the patterned first material layer 32'. Subsequent semiconductor processes, such as removing the patterned photoresist layer R2 and the mask 30, can then be performed.

The step of the second target pattern 22 of the second photomask 20 overlapping the first corresponding pattern Q of the first photomask 10 being transferred to the target material layer 42 of the wafer 40 is completed. As the second process P2 is achieved, only the part of the second target pattern 22 of the second photomask 20 which overlaps the first corresponding pattern Q of the first photomask 10 is transferred to the target material layer 42 or the wafer 40, even though the corresponding pattern of the second printable dummy pattern 24 is formed in the pattern photoresist layer R2 during the second process P2.

Figure 8:
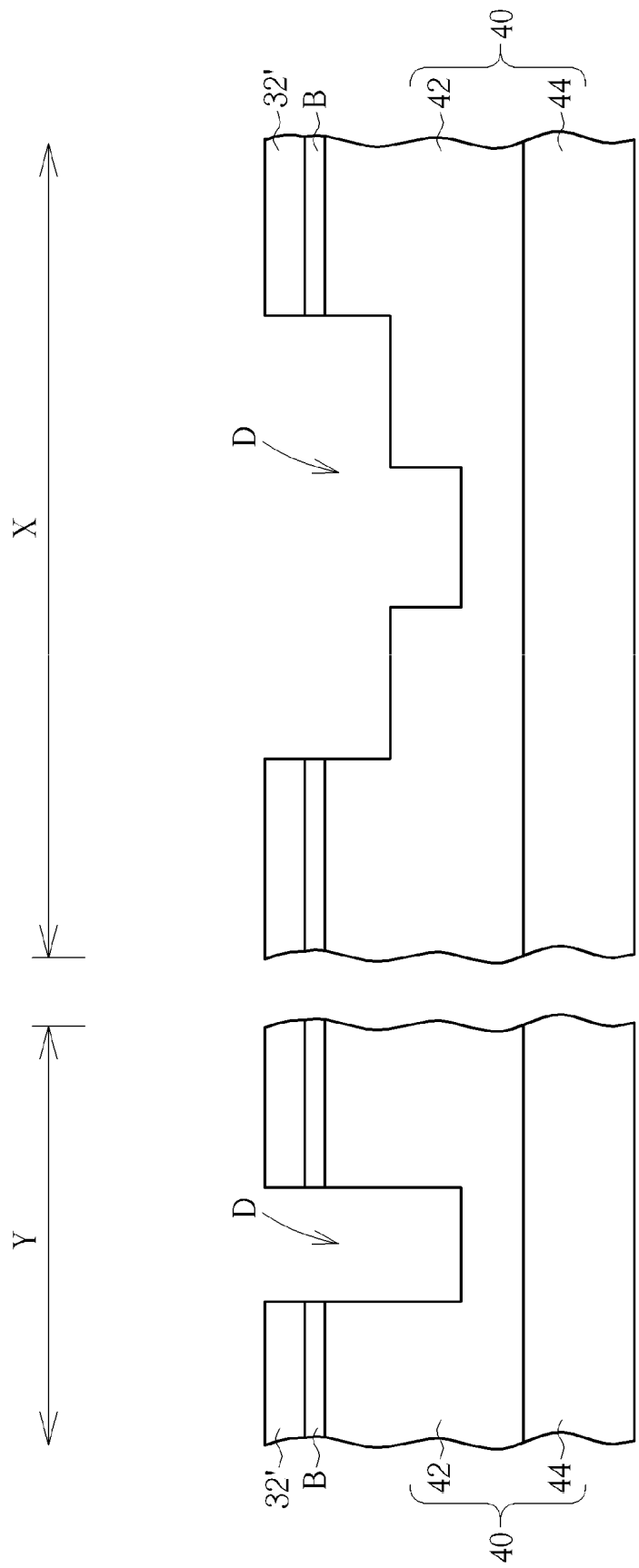

The pattern photoresist layer R2 may then be removed; the patterns of the patterned second material layer 34" and the patterned first material layer 32' may be transferred into the target material layer 42 or the wafer 40; the patterned second material layer 34" and the patterned first material layer 32' are removed to form a via D so as to form a dual damascene as shown in FIG. 8. Then, metals may be filled into the via D and be planarized immediately after.

To summarize, the present invention provides a method for forming photomasks, which forms a patterned mask, and in particular forms a patterned hard mask which is a metal layer, having a first target pattern from a first photomask, while a first unprintable dummy pattern of the first photomask is neither formed in the photoresist nor on the patterned mask during a first lithographic and etching procedure using the first photomask. A part of a second target pattern of a second photomask overlapping the first target pattern is transferred into the wafer, while a second printable dummy pattern on the second photomask is only formed in the photoresist without being transferred into the mask, the target material layer or the wafer during a second lithographic and etching procedure using the second photomask. The luminous flux of the second target pattern can be increased during the exposure step through increasing the dimension of the second target pattern, and a printed pattern with a smaller size can be obtained in the wafer, thereby shrinking the exposure limit of the second target pattern.

The first photomask of the present invention includes the first unprintable dummy pattern with a dimension smaller than the exposure limit so as to increase the luminous flux of the first target pattern during the exposure step, meaning that the first unprintable dummy pattern cannot be transferred by lithographing or etching. The second photomask of the present invention includes the second printable dummy pattern with a dimension larger than the exposure limit, to increase the luminous flux of the second target pattern during the exposure step. Since the first target pattern of the first photomask does not overlap the second printable dummy pattern, the hard mask on the wafer will prevent the second printable dummy pattern from being printed on the wafer as an etching process is performed by a second photomask, meaning that the second printable dummy pattern can be exposed and developed but cannot be transferred by etching. Moreover, even if the first photomask allows the first unprintable dummy pattern to increase the luminous flux of the first target pattern during the exposure step, the first unprintable dummy pattern still cannot be formed in the mask because the dimension of the first unprintable dummy pattern is smaller than the exposure limit, such that the second printable dummy pattern overlapping the first unprintable dummy pattern still cannot be printed in the wafer. The luminous flux of the second target pattern can be increased by forming the second printable dummy pattern with a dimension larger than the exposure limit next to the second target pattern, and the second printable dummy pattern can be prevented from being printed on the wafer by coupling it with the self-aligned via method, thereby shrinking the exposure limit of the second target pattern, which allows both the physical targets and the wafer layout to be achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming patterns, comprising:
providing a first layout comprising a first target pattern and a first unprintable dummy pattern, wherein the dimension of the first unprintable dummy pattern is smaller than the exposure limit; and
providing a second layout comprising a second target pattern and a second printable dummy pattern, wherein the dimension of at least part of the second printable dummy pattern which overlaps the first unprintable dummy pattern is larger than the exposure limit, such that the second printable dummy pattern cannot be formed in a wafer.

2. The method for forming patterns according to claim 1, wherein the first target pattern is formed on a mask on the wafer to form a first corresponding pattern in the mask.

3. The method for forming patterns according to claim 2, wherein as the first corresponding pattern is formed in the mask, a corresponding part of the wafer is exposed.

4. The method for forming patterns according to claim 2, wherein the first corresponding pattern comprises a trench pattern.

5. The method forming patterns according to claim 2, wherein the part of the second target pattern overlapping the first corresponding pattern is formed in the wafer so that a pattern is formed in the wafer, and the part of the second target pattern which does not overlap the first corresponding pattern is not formed in the wafer.

6. The method forming patterns according to claim 5, wherein the pattern formed in the wafer comprises at least a via.

7. The method forming patterns according to claim 5, wherein the pattern formed in the wafer is in an isolation (ISO) region of the wafer.

8. The method forming patterns according to claim 5, wherein the pattern formed in the wafer is formed by a self-aligned via method.

9. The method forming patterns according to claim 2, wherein the mask comprises a first material layer and a second material layer located on the first material layer.

10. The method forming patterns according to claim 9, wherein the first corresponding pattern is formed in the first material layer and the second material layer, the second target pattern is only transferred in the second material layer, and the part of the second target pattern overlapping the first corresponding pattern is directly formed on the wafer.

11. The method for forming patterns according to claim 10, further comprising:
performing a first process to form the first corresponding pattern in the first material layer and the second material layer; and
performing a second process to transfer the second target pattern in the second material layer but not in the first material layer and to etch the part of the wafer corresponding to the first corresponding pattern overlapping the second target pattern to form a pattern in the wafer.

12. The method for forming patterns according to claim 11, wherein the first material layer and the second material layer can be patterned by the first process and only the second material layer and the wafer can be patterned by the second process.

13. The method forming patterns according to claim 12, wherein the second material layer comprises an oxide layer, and the first material layer comprises a metal layer.

14. The method for forming patterns according to claim 1, wherein the first unprintable dummy pattern is located beside the first target pattern to increase the luminous flux of the first target pattern during an exposure step.

15. The method forming patterns according to claim 1, wherein the first unprintable dummy pattern comprises a trench pattern.

16. The method forming patterns according to claim 1, wherein the second target pattern comprises a via pattern.

17. The method for forming patterns according to claim 1, wherein the second printable dummy pattern surrounds the second target pattern.

18. The method forming patterns according to claim 1, wherein the second printable dummy pattern comprises a via pattern or a U-shaped pattern.

19. The method for forming patterns according to claim 1, wherein the second layout further comprises a second unprintable dummy pattern overlapping the first target pattern.

* * * * *